(12) United States Patent
Kasumi

(10) Patent No.: US 7,110,504 B2
(45) Date of Patent: Sep. 19, 2006

(54) RADIATION GENERATING APPARATUS, RADIATION GENERATING METHOD, EXPOSURE APPARATUS, AND EXPOSURE METHOD

(75) Inventor: Kazuyuki Kasumi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/132,345

(22) Filed: May 19, 2005

(65) Prior Publication Data

US 2005/0207527 A1 Sep. 22, 2005

Related U.S. Application Data

(62) Division of application No. 10/607,312, filed on Jun. 27, 2003, now Pat. No. 6,987,830.

(30) Foreign Application Priority Data

Jul. 8, 2002 (JP) .............................. 2002-199216

(51) Int. Cl.
*H05H 2/00* (2006.01)
*H05G 2/00* (2006.01)
(52) U.S. Cl. ................. 378/119; 250/492.2; 250/504 R
(58) Field of Classification Search ................. 378/34, 378/124–126, 143, 119; 250/492.2, 504 R
See application file for complete search history.

(56) References Cited

U.S. PATENT DOCUMENTS

| | | | |
|---|---|---|---|
| 4,644,576 A * | 2/1987 | Kuyel ......................... | 378/119 |
| 5,102,776 A * | 4/1992 | Hammer et al. ............. | 430/311 |
| 5,434,900 A | 7/1995 | Tanaka et al. ................ | 378/15 |
| 5,835,560 A | 11/1998 | Amemiya et al. ............ | 378/34 |
| 6,381,005 B1 | 4/2002 | Kasumi et al. ............... | 355/75 |
| 6,500,587 B1 * | 12/2002 | Ghandehari et al. ........... | 430/5 |
| 6,560,315 B1 | 5/2003 | Price et al. ................. | 378/144 |
| 6,661,018 B1 * | 12/2003 | McGregor et al. ...... | 250/504 R |
| 6,735,275 B1 | 5/2004 | Itoga et al. .................... | 378/34 |
| 6,744,851 B1 * | 6/2004 | Orsini et al. ................ | 378/119 |
| 6,917,411 B1 * | 7/2005 | Pierrat et al. .................. | 355/55 |
| 6,995,382 B1 * | 2/2006 | Ziener et al. ........... | 250/504 R |
| 2003/0035508 A1 | 2/2003 | Kasumi ....................... | 378/34 |

FOREIGN PATENT DOCUMENTS

EP 0 628 806 A2 12/1994

\* cited by examiner

*Primary Examiner*—Edward J. Glick
*Assistant Examiner*—Thomas R. Artman
(74) *Attorney, Agent, or Firm*—Fitzpatrick, Cella, Harper & Scinto

(57) ABSTRACT

An exposure apparatus for projecting and transferring a pattern on a master onto a surface of a target exposure object by radiation exposure, including a radiation generating unit for generating radiation having a plurality of different wavelengths, and a wavelength selecting unit for selecting a wavelength of the radiation generated by the radiation generating unit. The wavelength selecting unit acquires information on the pattern on the master, and selects a wavelength on the basis of wavelength information or wavelength distribution information contained in the acquired information.

5 Claims, 13 Drawing Sheets

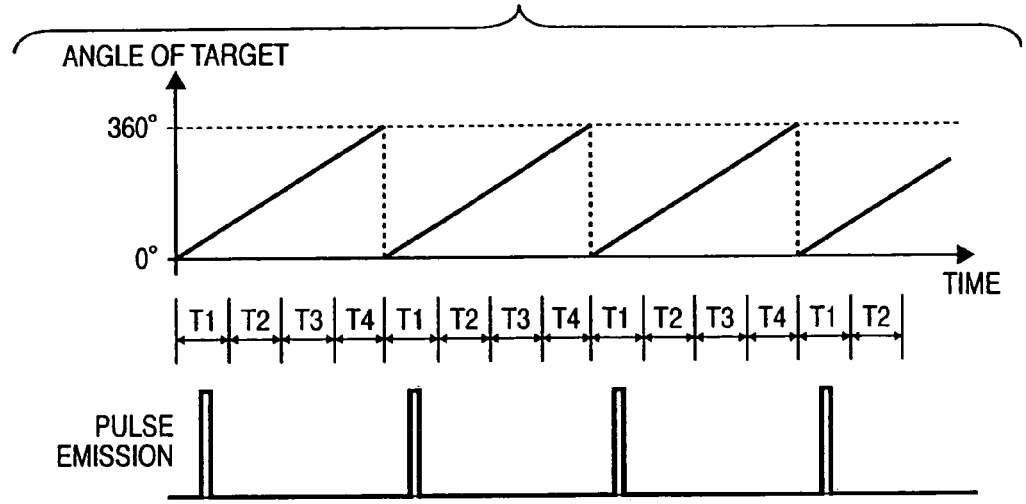
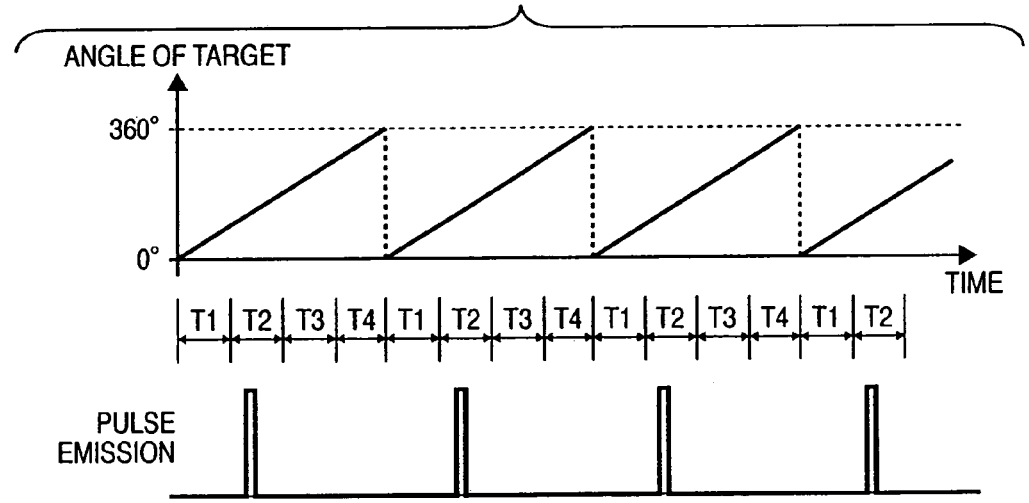
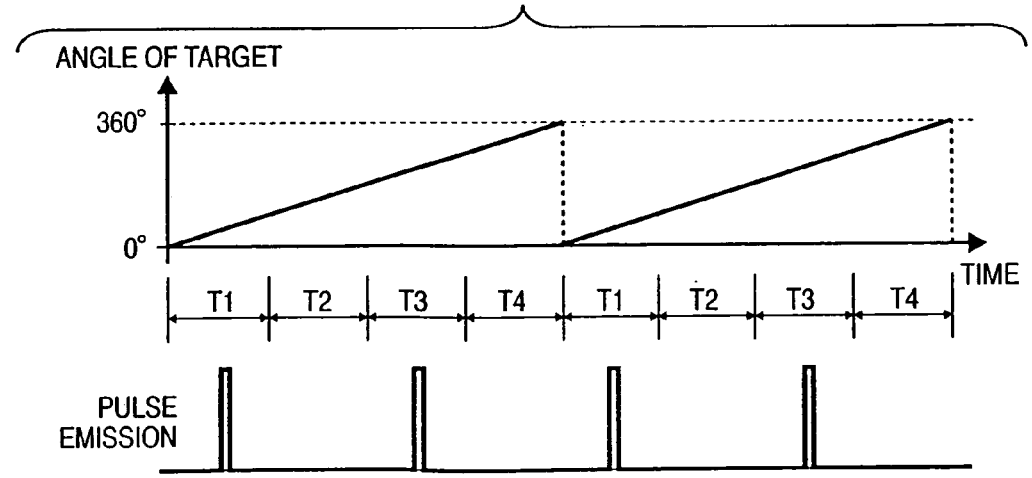

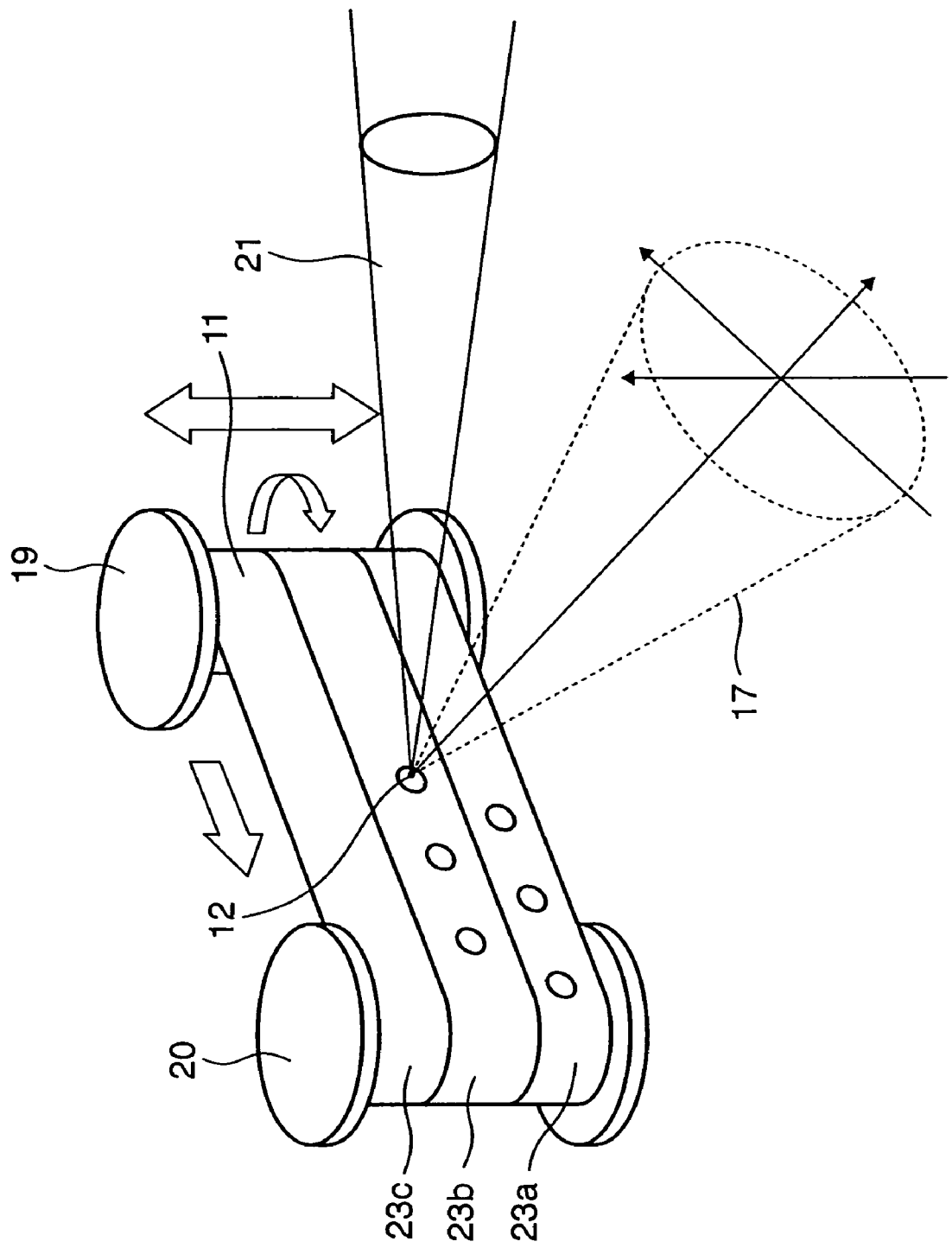

FIG. 11

```
URL  http://www.maintain.co.jp/db/input.html

TROUBLE DB INPUT WINDOW

OCCURRENCE DATE OF TROUBLE  [2000/3/15]~1404
MODEL  [* * * * * * * * *]~1401
SUBJECT  [OPERATION ERROR (START-UP ERROR)]~1403
DEVICE S/N  [465NS4580001]~1402
DEGREE OF URGENCY  [D]~1405
SYMPTOM   LED KEEPS FLICKERING          ~1406
          AFTER POWER ON

REMEDY    POWER ON AGAIN                ~1407
          (PRESS RED BUTTON IN ACTIVATION)

PROGRESS  INTERIM HAS BEEN DONE.        ~1408

[SEND] [RESET]    1410              1411              1412
               LINK TO RESULT LIST DATABASE   SOFTWARE LIBRARY   OPERATION GUIDE
```

RADIATION GENERATING APPARATUS, RADIATION GENERATING METHOD, EXPOSURE APPARATUS, AND EXPOSURE METHOD

This application is a divisional application of U.S. patent application Ser. No. 10/607,312, filed Jun. 27, 2003 now U.S. Pat. No. 6,987,830.

FIELD OF THE INVENTION

The present invention relates to an apparatus and a method of generating radiation having a plurality of different wavelengths. The present invention also relates to an exposure apparatus and an exposure method utilized in the manufacture of various types of devices, e.g., a semiconductor chip such as an IC or LSI, a display device such as a liquid crystal panel, a detection device such as a magnetic head, and an image sensing device such as a CCD.

BACKGROUND OF THE INVENTION

In recent years, as the packing density and operation speed of semiconductor integrated circuits increase, the pattern line width of the integrated circuits is decreased, and a higher-performance semiconductor fabricating method is sought. Accordingly, as an exposure apparatus used for resist pattern formation in the lithography process of the semiconductor fabrication process, an exposure apparatus utilizing a short exposure wavelength of, e.g., extreme ultraviolet rays such as a KrF laser (248 nm), an ArF laser (193 nm), or an $F_2$ laser (157 nm), or of X-rays (0.2 to 1.5 nm) has been developed.

In exposure using X-rays among these light beams, a proximity exposure method of moving an X-ray mask having a desired pattern to be close to a resist-coated wafer, and irradiating the wafer with X-rays through the X-ray mask, so that the mask pattern is transferred onto the wafer, has been developed.

In order to obtain high-intensity X-rays, an exposure method using synchrotron radiation is proposed. The technique has developed to such a degree that a pattern of 100 nm or less can be transferred. A synchrotron radiation source requires large-scale facilities. A profit cannot be expected unless device fabrication is performed by connecting ten or more exposure apparatuses to one light source. Hence, an exposure apparatus using a synchrotron radiation source is a system that is suitable for application to a highly demanded device such as a semiconductor memory.

In recent years, a device using GaAs has been input into practical use as a communication device, and a laser decrease in line width is required. Communication devices are produced in an amount less than that of semiconductor memories, and many types of communication devices are produced in small amounts. When an X-ray exposure system using synchrotron radiation as the light source is introduced to the fabrication of communication devices, it will probably make no profit. For this reason, an exposure apparatus using a compact X-ray source which generates high-intensity X-rays is used in actual communication device production. The light source ranges from one which is called a laser plasma beam source and generates a plasma by irradiating a target with a laser beam and uses X-rays generated by the plasma, to one which generates X-rays by generating a pinch plasma in a gas. These light sources are called point sources. According to a general arrangement, one exposure apparatus which transfers a pattern by aligning a mask and wafer is connected to one point source.

FIG. 6 schematically shows an X-ray exposure apparatus using a conventional point source.

Referring to FIG. 6, reference numeral 101 denotes an X-ray source unit for generating X-rays. In the X-ray source unit 101, a laser beam 121 is focused on a target 111 to irradiate it, in order to generate a plasma, thus generating X-rays 117. The X-rays 117 globally diverge from a light-emitting point 112. Some X-rays 117 are guided into a reduced-pressure He chamber 141 through an X-rays transmitting window 113.

A mask 131 has a transfer pattern. A wafer 133 coated with a photosensitive agent is positioned at a position with a small gap of about 10 μm from the membrane by an alignment unit (not shown). The wafer 133 is irradiated with the X-rays 117 emerging from the light-emitting point 112, so the pattern is transferred onto the wafer 133. The wafer 133 is sequentially stepped by a wafer stage 132 and is exposed successively. In some cases, a collimator is installed midway along the X-ray path between the light-emitting point 112 and mask 131 and focuses and collimates the X-rays.

The arrangement of the above conventional exposure apparatus will be described in further detail.

The conventional exposure apparatus is mainly comprised of the X-ray source unit (also to be referred to as a light source unit hereinafter) 101 and a main body 102. The light source unit 101 is set on the main body 102. The target 111 is arranged in the light source unit 101, and is irradiated with the laser beam 121 to generate a plasma, thereby generating the X-rays 117. The laser beam 121 is generated by a laser beam generating unit 122 separately installed on the floor, and is focused on the target 111 to be irradiated through a laser beam optical system (not shown).

The interior of the light source unit 101 is held at a vacuum, and the main body 102 is set in a reduced-pressure He atmosphere by the reduced-pressure He chamber 141. The light source unit 101 and the main body 102 are isolated from each other by the Be-made X-ray transmitting window 113 with a thickness of several μm, so that the vacuum atmosphere will not be spoiled. Beryllium has a high X-ray transmittance, but does not transmit He, so Be is used to form an X-ray transmitting window. A bellows A (denoted by reference numerals 116) is set between the light source unit 101 and reduced-pressure He chamber 141 to isolate them from the outside.

FIG. 7 shows the arrangement of the light source portion in detail.

The target 111 for generating the X-rays forms a tape, and is held as it is wound around a tape roll 119. The tape-like target 111 fed from the tape roll 119 is taken up by a takeup section 120. The focused laser beam 121 irradiates the target 111, extending between the tape roll 119 and takeup section 120, by pulse emission, and the X-rays 117 are radially generated from the light-emitting point 112 at each pulse. Every time the laser pulse is irradiated, the target 111 is gradually fed out and taken up by the takeup section 120. The target 111 is made of Cu or the like.

The main body 102 is set in the reduced-pressure He chamber 141, and is entirely maintained in the reduced-pressure He atmosphere by a helium atmosphere creating unit (not shown). This is because attenuation of the X-rays can be suppressed and a high heat transfer efficiency can be maintained if the atmosphere where the X-rays, as the exposure light, pass is set to a reduced-pressure He. The main body 102 is comprised of a mask stage (not shown) for holding and positioning the mask 131, the wafer stage 132 for holding, positioning, and stepping the wafer 133, a transfer system (not shown) for transferring the mask 131 and wafer 133, and a measurement system (not shown) for measuring the positions of the mask 131 and the wafer 133 relative to each other. The entire portion of the main body 102 is installed on the floor through vibration damping units 136. A stage surface plate 134 is set on the vibration damping units 136, and the wafer stage 132 moves on it, so that exposure is performed successively. A main body frame 137 is set on the stage surface plate 134, and supports the mask stage (not shown), the mask 131, and the like. The vibration damping units 136 prevent the positioning precisions of the mask 131 and wafer 133 that require precise positioning from being decreased by vibration from the floor, so the main body 102 maintains a constant posture.

Bellows B (denoted by reference numerals 142) are set between the reduced-pressure He chamber 141 and main body 102 so the reduced-pressure He atmosphere will not be spoiled when the posture of the main body 102 changes.

In the conventional apparatus arrangement described above, the light source unit 101 uses one type of target 111 as the X-ray generating source. The spectral intensity of the emitted X-rays depends on the type of the target 111. FIG. 8A shows an example of a transfer pattern intensity distribution on the wafer surface, which is obtained when a Line & Space pattern is exposed with the conventional exposure apparatus. In this example, the small gap distance (exposure gap) between the mask and wafer is 10 μm.

Ideally, the exposure apparatus resolves an image irrespective of the pattern, as shown in FIG. 8B. Factors that determine the image intensity distribution also include the material and thickness of the mask. As shown in FIG. 8A, with a 100-nm pattern, the intensity image is formed faithfully in accordance with the mask pattern. With a 70-nm Line & Space pattern, however, the image loses its shape, and the contrast decreases, so the image is not resolved. In other words, with the conventional X-ray generating source, since the exposure wavelength is a specific wavelength, depending on the mask pattern, the influence of diffraction becomes conspicuous, and sometimes, the image cannot be resolved. In this example, the pattern loses its shape and the contrast decreases. Depending on the pattern, a positional error may occur.

This problem may be avoided if the exposure gap is set to an appropriate amount. When the exposure gap changes, however, as the exposure light broadens, the positional error of the pattern to be transferred increases, and an overlaying error occurs. Therefore, this countermeasure cannot be used in practice.

SUMMARY OF THE INVENTION

The present invention has been made in view of the above problems, and has as its object to provide a radiation generating apparatus, a radiation generating method, an exposure apparatus, and an exposure method with which a plurality of different exposure wavelengths (spectra) are generated, and exposure wavelengths are selected or combined in accordance with the transfer pattern, so that a decrease in resolution can be suppressed.

In order to solve the above problems and to achieve the above object, a radiation generating apparatus and radiation generating method according to the present invention comprise radiation generating means (or step) for generating radiation having a plurality of different wavelengths, and wavelength selecting means (or step) for selecting a wavelength of the radiation generated by the radiation generating means.

Preferably, the radiation generating means (or step) has plasma exciting means (or step) and a plurality of different types of light-emitting portions (targets) plasma-excited by the plasma exciting means, and the wavelength selecting means has means for selecting and switching the light-emitting portions.

Preferably, the plasma exciting means comprises laser exciting means.

Preferably, the plurality of light-emitting portions are divided into a plurality of portions and arranged in a radial direction of a circular disk, and the wavelength selecting means has a driving portion for rotationally driving the disk.

Preferably, the apparatus and method further comprise a synchronization control unit (step) for synchronizing a time when the plasma exciting means excites a plasma and a time when the wavelength selecting means selects and switches the light-emitting portions.

Preferably, the apparatus further comprises a synchronization control unit for synchronizing a time when the plasma exciting means excites a plasma and a rotational angular position of the driving portion.

More specifically, the radiation comprises X-rays.

Preferably, the radiation generating apparatus or method is applied to an exposure apparatus or exposure method of projecting and transferring a pattern on a master onto a surface of a target exposure object by radiation exposure.

In the exposure apparatus, the wavelength selecting unit acquires information on the pattern on the master, and selects a wavelength on the basis of wavelength information or wavelength distribution information contained in the acquired information.

Preferably, the wavelength selecting unit selects a combination of a plurality of different wavelengths from the wavelength information.

Desirably, the present invention is also applied to a semiconductor device manufacturing method comprising steps of installing manufacturing apparatuses, including the exposure apparatus, for performing various processes in a semiconductor manufacturing factory, and manufacturing a semiconductor device in a plurality of processes by using the manufacturing apparatuses.

Preferably, the semiconductor device fabrication method further comprises steps of connecting the manufacturing apparatuses by a local area network, and communication information about at least one of the manufacturing apparatuses between the local area network and an external network of the semiconductor manufacturing factory.

Preferably, maintenance information of the manufacturing apparatus is acquired by data communication by accessing a database provided by a vendor or user of the exposure apparatus via the external network, or production is managed by data communication via the external network with a semiconductor manufacturing factory other than the semiconductor manufacturing factory.

Furthermore, the present invention is also applied to a semiconductor manufacturing factory comprising manufacturing apparatuses, including the exposure apparatus, for performing various processes a local area network for connecting the manufacturing apparatuses, and a gateway for allowing the local area network to access an external network of the factory, wherein information about at least one of the manufacturing apparatuses is communicated by connection to the external network.

The present invention is also applied to a maintenance method for the exposure apparatus that is installed in a semiconductor manufacturing factory, comprising steps of causing a vendor or user of the exposure apparatus to provide a maintenance database connected to an external network of the semiconductor manufacturing factory, authenticating access from the semiconductor manufacturing factory to the maintenance database via the external network, and transmitting maintenance information accumulated in the maintenance database to the semiconductor manufacturing factory via the external network.

Preferably, the exposure apparatus further comprises a display, a network interface, and a computer for executing communication software and enables communicating maintenance information of the exposure apparatus via a computer network.

Preferably, the communication software is connected to an external network of a factory where the exposure apparatus is installed, provides on the display a user interface for accessing a maintenance database provided by a vendor or user of the exposure apparatus, and enables obtaining information from the database via the external network.

As described above, according to the present invention, desired wavelengths or a combination thereof can be selected from a plurality of different wavelengths. Hence, an influence of diffraction depending on the mask pattern during exposure can be reduced to improve the resolution, so that a higher-precision transfer pattern can be obtained, and a smaller (higher-performance) semiconductor device can be manufactured.

When wavelength information (spectrum data) contained in information on the mask pattern is used, the wavelength of the exposure light can be selected easily, so that operational mistakes can be decreased, and a decrease in yields can be prevented.

Other objects and advantages besides those discussed above shall be apparent to those skilled in the art from the description of a preferred embodiment of the invention which follows. In the description, reference is made to the accompanying drawings, which form a part thereof, and which illustrate an example of the invention. Such an example, however, is not exhaustive of the various embodiments of the invention, and, therefore, reference is made to the claims which follow the description for determining the scope of the invention.

BRIEF DESCRIPTION OF THE DRAWINGS

FIGS. 3A to 3C are timing charts for explaining wavelength selection control according to the first embodiment of the present invention;

FIG. 4 is a view showing the detailed arrangement of a target according to the second embodiment of the present invention;

FIG. 11 shows a practical example of a user interface in the semiconductor device production system including the exposure apparatus according to one embodiment of the present invention;

DETAILED DESCRIPTION OF THE PREFERRED EMBODIMENTS

The preferred embodiments of the present invention will be described with reference to the accompanying drawings.

[Schematic Arrangement of an Exposure Apparatus]

The first embodiment to which the present invention is applied will be described with reference to FIG. 1.

In the first embodiment, the present invention is applied to a proximity X-ray exposure apparatus using a point source as the light source.

Figure 1:
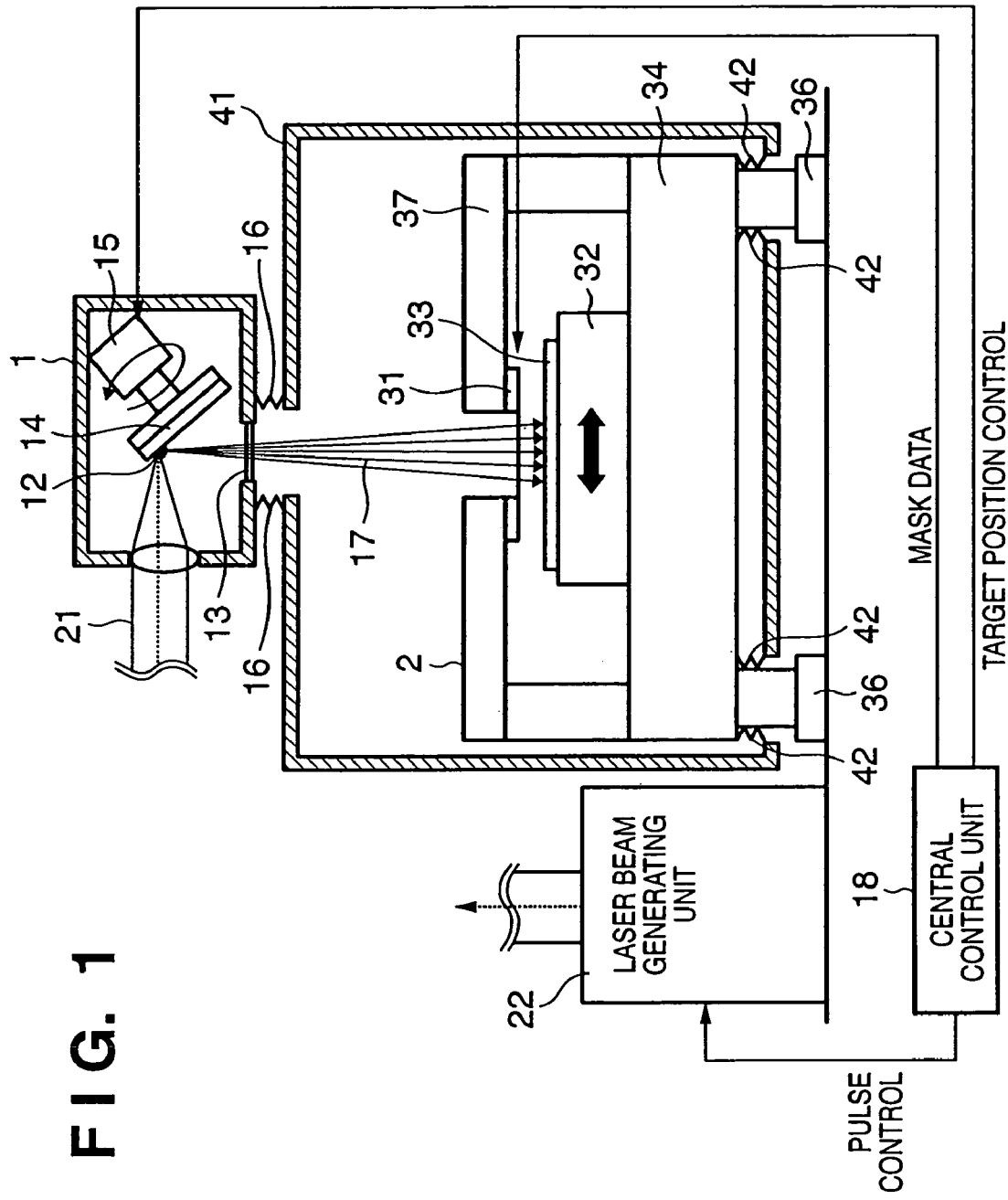
FIG. 1 is a schematic view showing an exposure apparatus according to the first embodiment of the present invention.

Referring to FIG. 1, the exposure apparatus of this embodiment is mainly comprised of a light source unit 1 and a main body 2. The X-ray source unit 1 is set on the main body 2. A circular disk-like target 14 is arranged in the X-ray source unit 1. A laser beam 21 is focused on the circular disk-like target 14 to irradiate it, thereby generating a plasma and then X-rays 17. The laser beam 21 is generated by a laser beam generating unit 22 separately installed on the floor, and irradiates the circular disk-like target 14 through a laser beam optical system (not shown).

The interior of the light source unit 1 is held at a vacuum, and the interior of the main body 2 is set in a reduced-pressure He atmosphere by a reduced-pressure He chamber 41. The light source unit 1 and the main body 2 are isolated from each other by a beryllium X-ray transmitting window 13 with a thickness of several µm, so that the vacuum atmosphere will not be spoiled. Beryllium has a high X-ray transmittance, but does not transmit He, so beryllium is used to form an X-ray transmitting window. A bellows A (denoted by reference numerals 16) is set between the X-ray source unit 1 and reduced-pressure He chamber 41 to isolate them from the outside.

Figure 2:
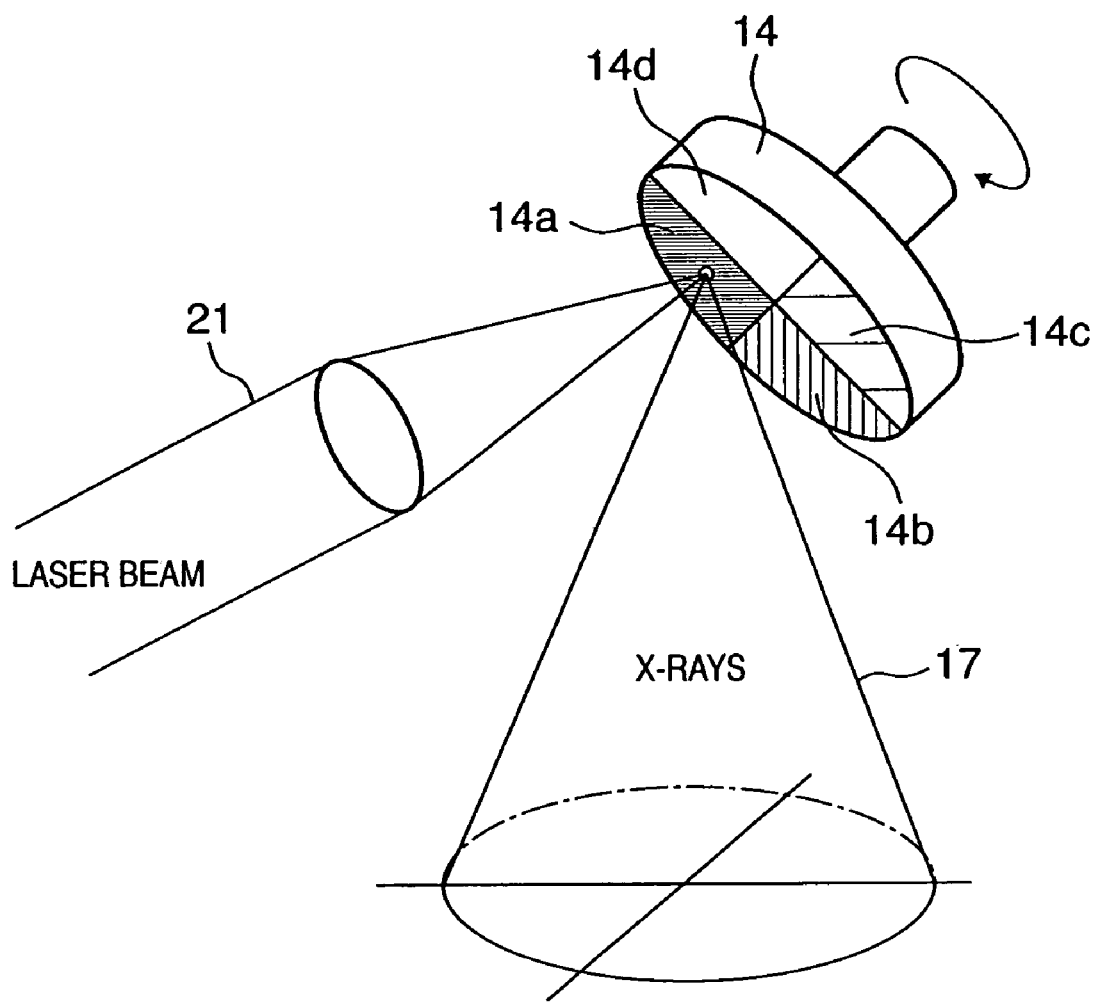
FIG. 2 is a view showing the detailed arrangement of a target according to the first embodiment of the present invention.

FIG. 2 shows the arrangement of the light source portion in detail.

The circular disk-like target 14 for generating the X-rays has four types of quadrants, first-, second-, third-, and fourth-wavelength light-emitting portions 14a, 14b, 14c, and 14d, which are made of different materials and divided equiangularly (e.g., at 90°) in the radial direction.

The laser beam 21 is emitted (pulse emission) by controlling the laser beam generating unit 22 with a pulse signal, and is focused on the circular disk-like target 14. The X-rays 17 are radially generated from the target 14 at each pulse emission. The target 14 is rotatably controlled by a rotational drive mechanism 15 in synchronism with pulse emission. As the rotational angle of the target 14 is controlled in synchronism with emission of the laser beam 21, the material (type) of the target 14 can be selected from the first-, second-, third-, and fourth-wavelength light-emitting portions 14a, 14b, 14c, and 14d. As the material of the target 14, a metal material, such as Cu, W, or Fe, is employed.

The main body 2 comprises a mask stage (not shown) for holding and positioning a mask 31, a wafer stage 32 for holding, positioning, and stepping a wafer 33, a transfer system (not shown) for transferring the mask 31 and wafer 33, and a measurement system (not shown) for measuring the positions of the mask 31 and wafer 33 relative to each other. The main body 2 is installed in the reduced-pressure He chamber 41, and its interior is entirely maintained in a reduced-pressure He atmosphere by a He atmosphere generating unit (not shown). In this manner, when the atmosphere, where the X-rays, as the exposure light pass, is set at the reduced-pressure He, the attenuation of the X-rays can be suppressed, and a high heat transfer efficiency can be maintained.

The main body 2 is installed on the floor through vibration damping units 36. A stage surface plate 34 is set on the vibration damping units 36, and the wafer stage 32 holding the wafer 33 performs exposure while successively moving on the stage surface plate 34, so that the circuit pattern formed on the mask 31 is transferred onto the surface of the wafer 33. A main body frame 37 is set on the stage surface plate 34, and the mask stage (not shown), the mask 31, and the like, are supported by the main body frame 37.

The vibration damping units 36 prevent the positioning precisions of the mask and wafer that require precise positioning from being decreased by vibration from the floor, so the main body 2 maintains a constant posture. Bellows B (denoted by reference numerals 42) are set between the reduced-pressure He chamber 41 and main body 2 so the reduced-pressure He atmosphere will not be spoiled when the posture of the main body 2 changes.

An exposure light wavelength selecting method of this embodiment will be described.

As described above, the wavelength of the X-rays generated by the target 14 is determined by the material of the target irradiated with the laser beam 21. The target 14 of this embodiment generates four different types of wavelengths depending on the difference in material, i.e., a wavelength T1 from its first-wavelength light-emitting portion 14a, a wavelength T2 from its second-wavelength limit-emitting portion 14b, a wavelength T3 from its third-wavelength light-emitting portion 14c, and a wavelength T4 from its fourth-wavelength light-emitting portion 14d.

FIGS. 3A to 3C show the rotational angular position of the rotational drive mechanism 15 and pulse emission timing in wavelength selection control of irradiating, with the laser beam, any one of the first-, second-, third-, and fourth-wavelength light-emitting portions 14a, 14b, 14c, and 14d of the circular disk-like target 14.

The laser beam 21 requires a high energy in order to excite the plasma and, accordingly, cannot be emitted continuously. Thus, the laser beam 21 is emitted in a pulse manner concentratedly during a short nsec-order period of time.

FIG. 3A shows a control example in which the first-wavelength light-emitting portion 14a is irradiated with the laser beam 21 to generate X-rays 17 having the wavelength T1. The rotational angular position of the circular disk-like target 14 and the pulse emission period are synchronized, and pulse emission is performed at every rotational angle (0–90°) corresponding to the first-wavelength light-emitting portion 14a (alternatively, the target 14 is rotated in synchronism with pulse emission to irradiate the first-wavelength light-emitting portion 14a with the laser beam 21). Thus, the laser beam 21 irradiating the first-wavelength light-emitting portion 14a excites the plasma, so the first-wavelength light-emitting portion 14a generates X-rays having the wavelength T1.

The timing of the angle sensor set in the rotational drive mechanism 15 with the trigger of the emission pulse is controlled by a central control unit 18, so the pulse emission timing and the rotation angular position of the target 14 are synchronized.

When X-rays having the wavelength T2 are to be generated by the second-wavelength light-emitting portion 14b, as shown in FIG. 3B, pulse emission is performed at every rotational angle (90°–180°) corresponding to the second-wavelength light-emitting portion 14b (alternatively, the target 14 is rotated in synchronism with pulse emission to irradiate the second-wavelength light-emitting portion 14b with laser beam 21). Thus, the laser beam 21 irradiating the second-wavelength light-emitting portion 14b excites the plasma, so the second-wavelength light-emitting portion 14b generates X-rays having the wavelength T2.

As described above, when X-rays are to be generated by a single-wavelength light-emitting portion (when X-rays having a single wavelength are to be generated), the rotational angular position of the circular disk-like target 14 and the pulse emission timing need not be controlled to be synchronized. This X-ray generation can be realized also by fixing the rotational angular position of the target 14.

Wavelength selection control that takes place when X-rays having a plurality of different wavelengths are to be generated will be described.

FIG. 3C shows the relationship between the rotational angular position of the target 14 and the pulse emission timing when the X-rays having the wavelength T1 and the X-rays having the wavelength T3 are to be respectively generated by the first- and third-wavelength light-emitting portions 14a and 14c at a ration of 1:1. For example, when the pulse emission period is maintained with no delay and the rotational speed of the target 14 is set to one-half that shown in FIG. 3A or 3B, X-rays having the wavelength T1 and X-rays having the wavelength T3 are generated at a ratio of 1:1. Then, the spectral distribution of the X-rays provided for exposure becomes broader, and an optical wavelength distribution can be obtained for exposure with a specific pattern. According to another control example, the rotational drive mechanism 15 may be rotationally driven nonlinearly, so that the target can be selected at an arbitrary ratio.

In the above control example, synchronization control of the pulse emission period and the rotational angular position by means of the rotational drive mechanism 15 is performed by the central control unit 18. Alternatively, the rotational angle of the circular disk-like target 14 may be controlled by the rotational drive mechanism 15 to match the pulse emission period.

In the above embodiment, the central control unit 18 acquires various types of data concerning the mask used for performing exposure on the basis of mask data stored in the mask 31, and automatically selects the exposure wavelength in accordance with the exposure wavelength and wavelength distribution characteristics contained in the mask data, thus performing exposure. Therefore, input omission and input error can be decreased compared to a case wherein the operator selects the wavelength to match the mask pattern.

The separation (period) of pulse emission depends on the performance of the laser beam source. When the present invention is applied to an exposure apparatus, the shorter the separation of pulse emission, the higher the exposure light intensity per unit time, so that the exposure time per shot is shortened and the throughput of the apparatus increases. On the other hand, if selection of the target type takes much time, a wasteful time occurs, and the throughput of the apparatus decreases.

Therefore, according to this embodiment, pulse emission of the laser beam is always performed with the maximum period that the laser beam source allows, and target selection is controlled by changing the position (angle) of the target.

In the above-example, the respective-wavelength light-emitting portions are obtained by dividing the target 14 by four in accordance with the different materials. Even if the target 14 is divided by a number other than four, the resultant effect is not adversely affected at all. In the above description, the target 14 is driven only by rotation. If a driving portion for translating the target 14 is provided and, accordingly, the laser beam irradiation position by pulse emission is variable in the direction of the locus of movement, the laser beam irradiation position on the target 14 becomes variable, so that the service life of the target 14 can be prolonged.

SECOND EMBODIMENT

FIG. 4 is a view showing the detailed arrangement of a target according to the second embodiment of the present invention. This target is applied to the X-ray exposure apparatus in the same manner as in the first embodiment. The schematic arrangement of the exposure apparatus is identical to that of the first embodiment, and a detailed description thereof will accordingly be omitted.

The second embodiment is different from the first embodiment only in the shape of the target of a light source unit 1. Hence, only the target as the wavelength selecting portion of the light source unit will be described.

Referring to FIG. 4, in a target 11, a fifth-wavelength light-emitting portion 23a (wavelength T5), sixth-wavelength light-emitting portion 23b (wavelength T6), and seventh-wavelength light-emitting portion 23c (wavelength T7) made of different materials form tapes, and align themselves as three rows in the widthwise direction. The respective-wavelength light-emitting portions 23a to 23c of the target 11 are held as they are wound around a tape roll 19. The tape-like target 11 fed from the tape roll 19 is taken up by a takeup section 20 on the other side. A focused laser beam 21 irradiates the target 11, extending between the tape roll 19 and takeup section 20, by pulse emission, and X-rays 17 are radially generated from a light-emitting point 12 at each pulse. Every time the laser pulse is irradiated, the target 11 is gradually fed out, and a new target surfaces appears and is taken up by the takeup section 20.

The entire target unit is loaded in a driving unit (not shown) which drives in the vertical (widthwise) direction, and vertically moves the target 11 at each pulse, so that the target 11 to be irradiated with the laser beam 21 can be selected from the respective-wavelength light-emitting portions 23a to 23c. In the example of FIG. 4, X-rays are generated by irradiating the fifth- and sixth-wavelength light-emitting portions 23a and 23b with the laser beam at a ratio of 1:1. The X-rays from the from the fifth-wavelength light-emitting portion 23a and the X-rays from the sixth-wavelength light-emitting portion 23b are irradiated alternately at every other pulse.

According to this embodiment, when the target is selected in accordance with the required X-ray wavelength, a desired X-ray wavelength can be obtained, and an exposure wavelength optimal for the mask pattern can be used. Therefore, a pattern that cannot be resolved with a single target can be resolved by one exposure apparatus. The mask data has exposure wavelength data. This is the same as in the first embodiment.

THIRD EMBODIMENT

Figure 5:
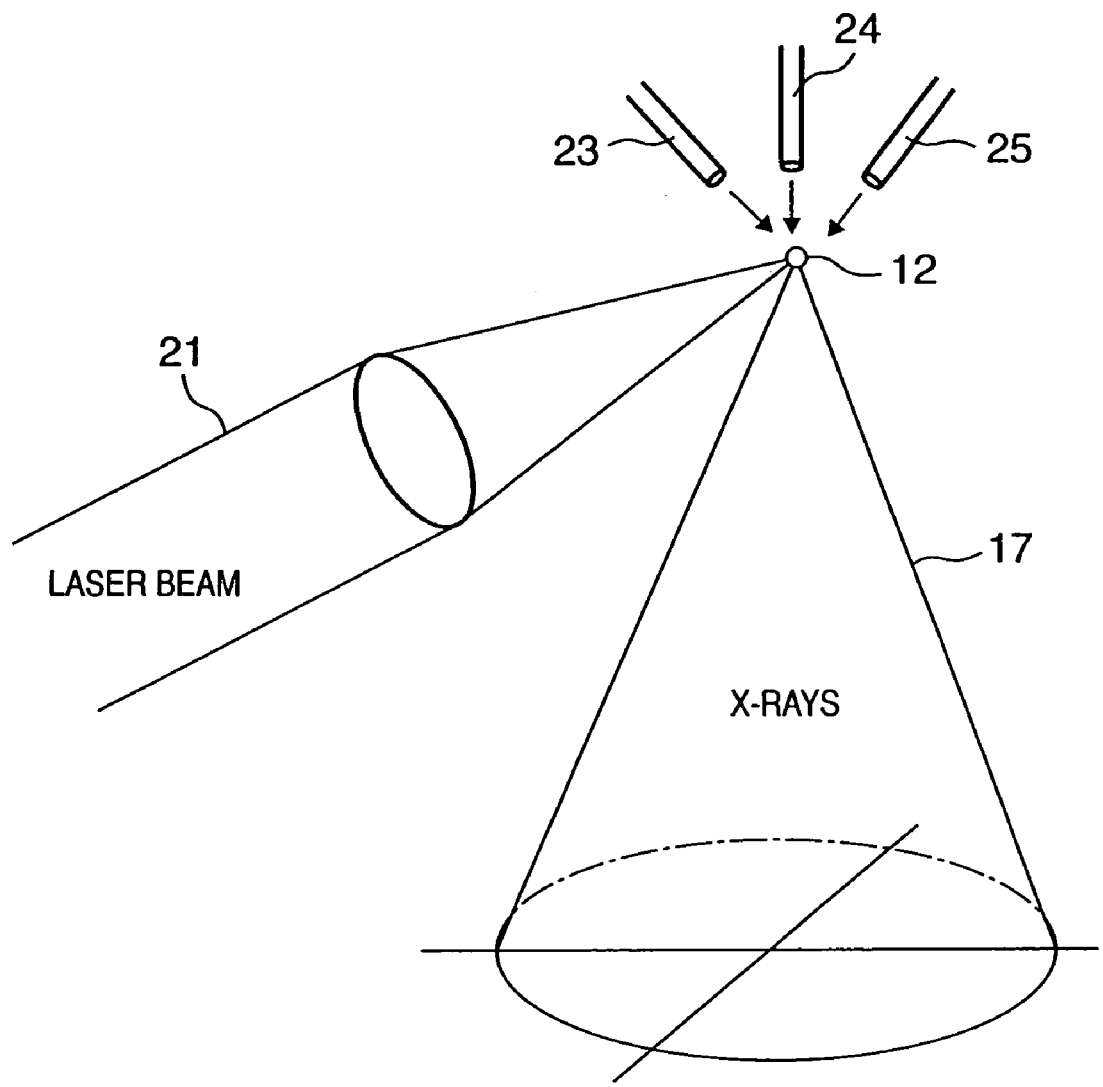
FIG. 5 is a view showing the detailed arrangement of a target according to the third embodiment of the present invention.
Figure 6:
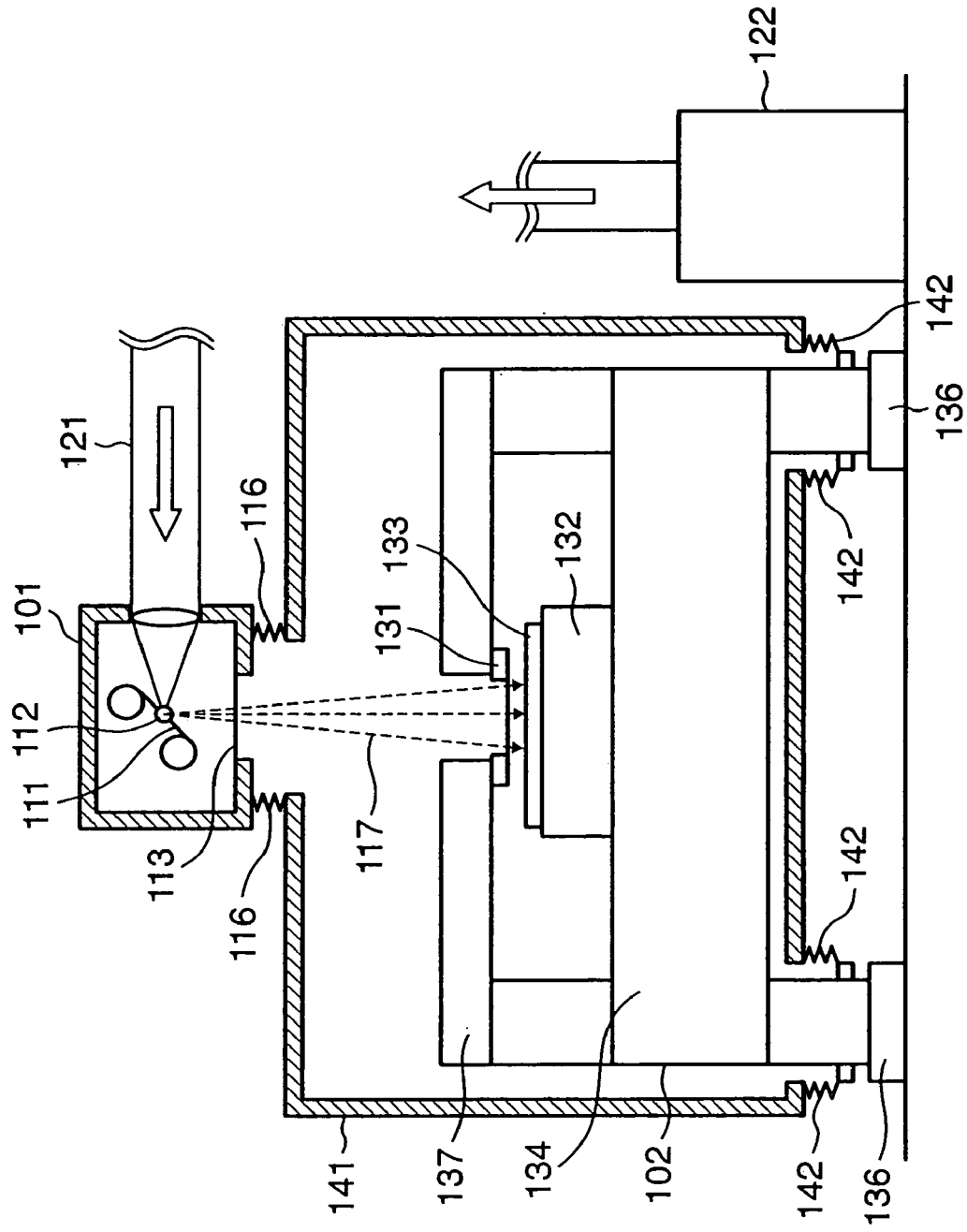
FIG. 6 is a schematic view showing a conventional exposure apparatus.
Figure 7:
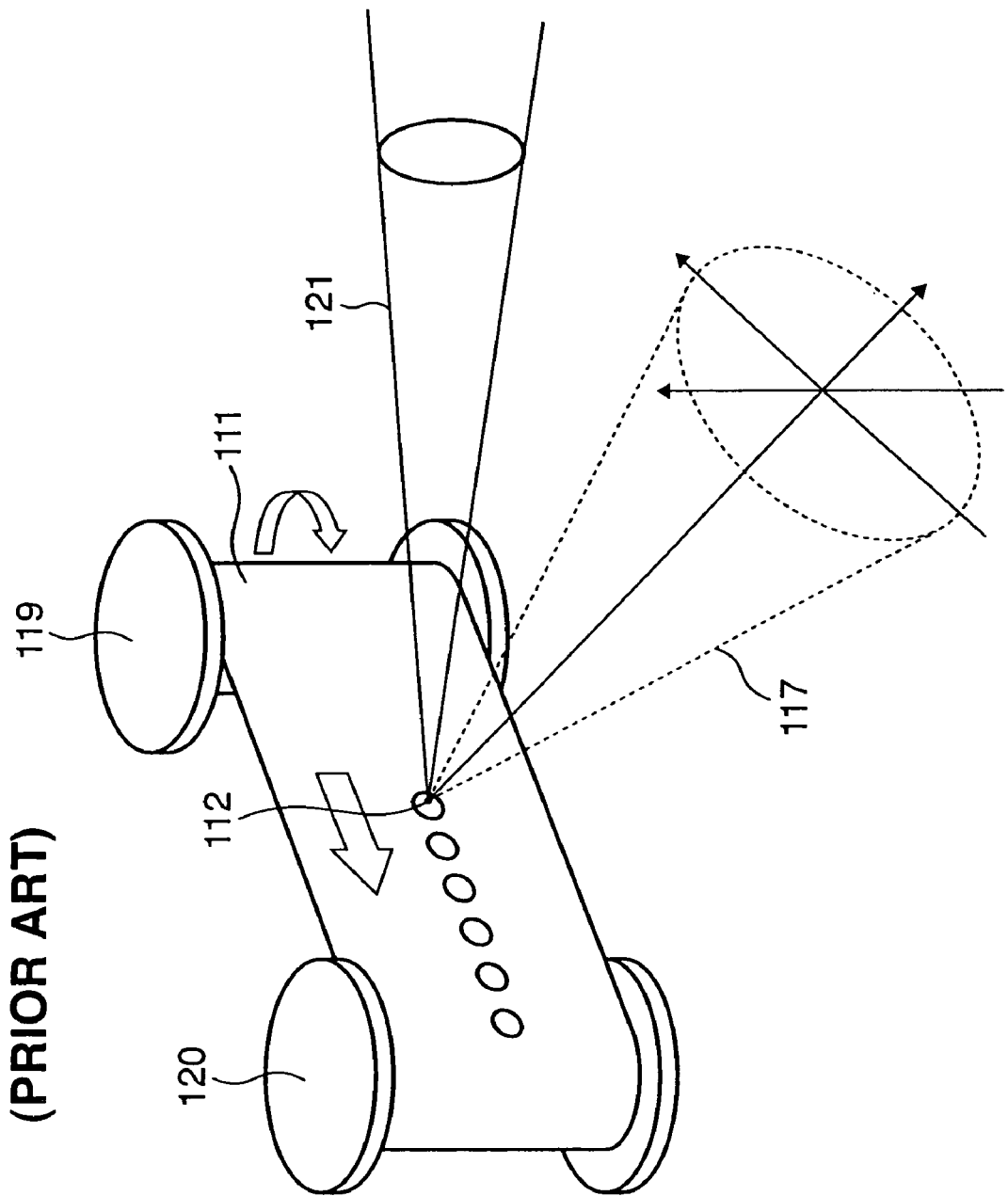
FIG. 7 is a view showing the detailed arrangement of a convention target.
Figure 8A:
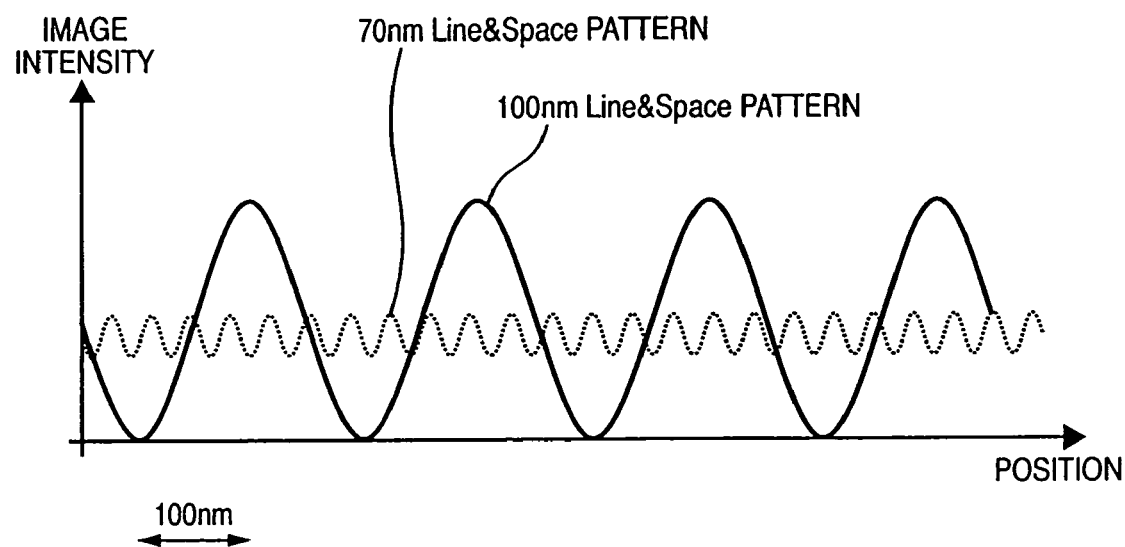
FIGS. 8A and 8B are graphs for explaining problems of the prior art.
Figure 8B:
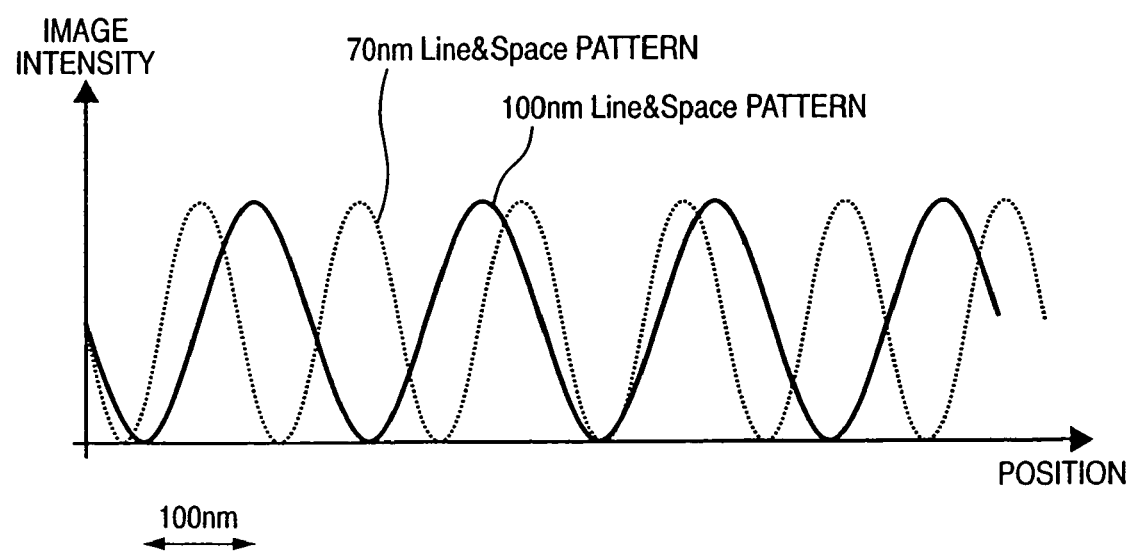

FIG. 5 shows the arrangement of a target according to the third embodiment. In the third embodiment, the present invention is applied to a proximity X-ray exposure apparatus in the same manner as in the first embodiment.

The arrangement of the entire exposure apparatus is identical to that of the first embodiment, and a detailed description thereof will accordingly be omitted. A description will be made only on the arrangement of a light source unit as a characteristic portion different from that of the first embodiment.

According to the third embodiment, the light source unit generates X-rays on the following principle. Namely, liquefied gas (target) is sprayed, and is irradiated with a laser beam 21, so it is excited in a plasma state, thus generating X-rays. The light source unit is installed in a vacuum chamber in the same manner as in the first embodiment. The object corresponding to the target is liquefied gas, and is sprayed from first, second, or third nozzle 23, 24, or 25. An inert gas such as Xe or Ne is employed as the gas serving as the target (target gas). The inert gas adiabatically expands rapidly when it is sprayed from the nozzle. At this time, the inert gas is deprived of latent heat, so part of the sprayed target gas liquefies. In synchronism with the liquefaction timing, a laser beam is focused on the target gas to irradiate it, to excite the target gas in a plasma state. Thus, X-rays depending on the type (physical properties) of the target gas sprayed from the selected nozzle are generated.

After generating the X-rays, the target gasifies instantaneously and is quickly discharged to the outside of the chamber by an exhaust system (not shown). Thus, the interior of the chamber is held at a constant vacuum degree.

In this manner, when a target gas is selected and sprayed in accordance with a desired X-ray wavelength, the desired X-ray wavelength can be obtained, and X-rays having an exposure wavelength optimal for the mask pattern can be used. Therefore, even a mask pattern that cannot be resolved sufficiently with single-wavelength exposure light can be resolved by one exposure apparatus with an improved resolution.

The nozzles are selected automatically in accordance with the exposure wavelength or wavelength distribution characteristics contained in the mask data stored in the mask 31, in the same manner as in the first embodiment. Then, exposure is performed with the selected nozzle.

[Semiconductor Production System]

A production system for producing a device of a semiconductor, or the like (e.g., a semiconductor chip such as an IC or LSI, a liquid crystal panel, a CCD, a thin-film magnetic head, a micromachine, or the like), using the exposure apparatus will be exemplified. The system performs maintenance services such as trouble-shooting, periodic maintenance, and software distribution for manufacturing apparatuses installed in a semiconductor manufacturing factory by utilizing a computer network outside the manufacturing factory.

Figure 9:
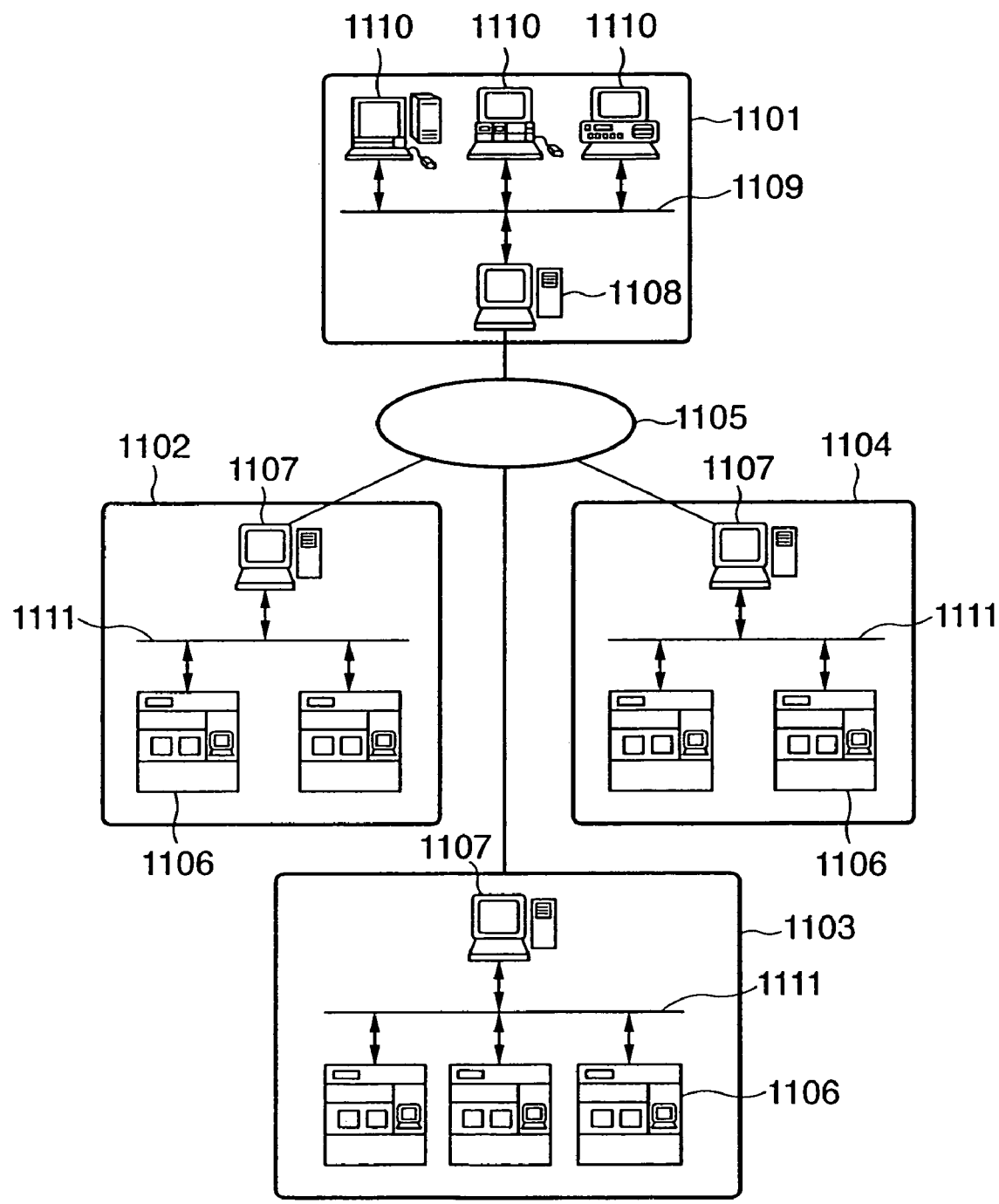
FIG. 9 is a conceptual diagram seen from a certain angle of a semiconductor device production system including an exposure apparatus according to one embodiment of the present invention.

FIG. 9 shows the overall system cut out at a given angle. In FIG. 9, reference numeral 1101 denotes an office of a vendor (e.g., an apparatus supply manufacturer), which provides a semiconductor device manufacturing apparatus. Examples of the manufacturing apparatus are semiconductor manufacturing apparatuses for performing various processes used in a semiconductor manufacturing factory, such as pre-process apparatuses (e.g., a lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The office 1101 comprises a host management system 1108, which provides a maintenance database for the manufacturing apparatus, a plurality of operation terminal computers 1110, and a LAN (Local Area Network) 1109, which connects the host management system 1108 and computers 1110 to build an intranet, or the like. The host management system 1108 has a gateway for connecting the LAN 1109 to the Internet 1105 serving as an external network of the office, and a security function for limiting external access.

Reference numerals 1102 to 1104 denote manufacturing factories of the semiconductor manufacturer as users of manufacturing apparatuses. The manufacturing factories 1102 to 1104 may belong to different manufacturers or the same manufacturer (e.g., a pre-process factory, a post-process factory, and the like). Each of the factories 1102 to 1104 is equipped with a plurality of manufacturing apparatuses 1106, a LAN (Local Area Network) 1111, which connects these apparatuses 1106 to construct an intranet, or the like, and a host management system 1107 serving as a monitoring apparatus which monitors the operation status of each manufacturing apparatus 1106. The host management system 1107 in each of the factories 1102 to 1104 has a gateway for connecting the LAN 1111 in the factory to the Internet 1105 serving as an external network of the factory. Each factory can access the host management system 1108 of the vendor 1101 from the LAN 1111 via the Internet 1105. The security function of the host management system 1108 typically permits only a limited user to access the host management system 1108. More specifically, the factory can notify the vendor via the Internet 1105 of status information (e.g., the symptom of a manufacturing apparatus in trouble) representing the operation status of each manufacturing apparatus 1106. Also, the vendor can transmit, to the factory, response information (e.g., information designating a remedy against the trouble, or remedy software or data) corresponding to the notification, or maintenance information such as the latest software or help information. Data communication between the factories 1102 to 1104 and the vendor 1101 and data communication via the LAN 1111 in each factory typically adopt a communication protocol (TCP/IP) generally used in the Internet. Instead of using the Internet as an external network of the factory, a high-security dedicated network (e.g., an ISDN), which inhibits access of a third party, can be adopted. The host management system is not limited to the one provided by the vendor. The user may construct a database and set the database on an external network, and the host management system may authorize access to the database from a plurality of user factories.

Figure 10:
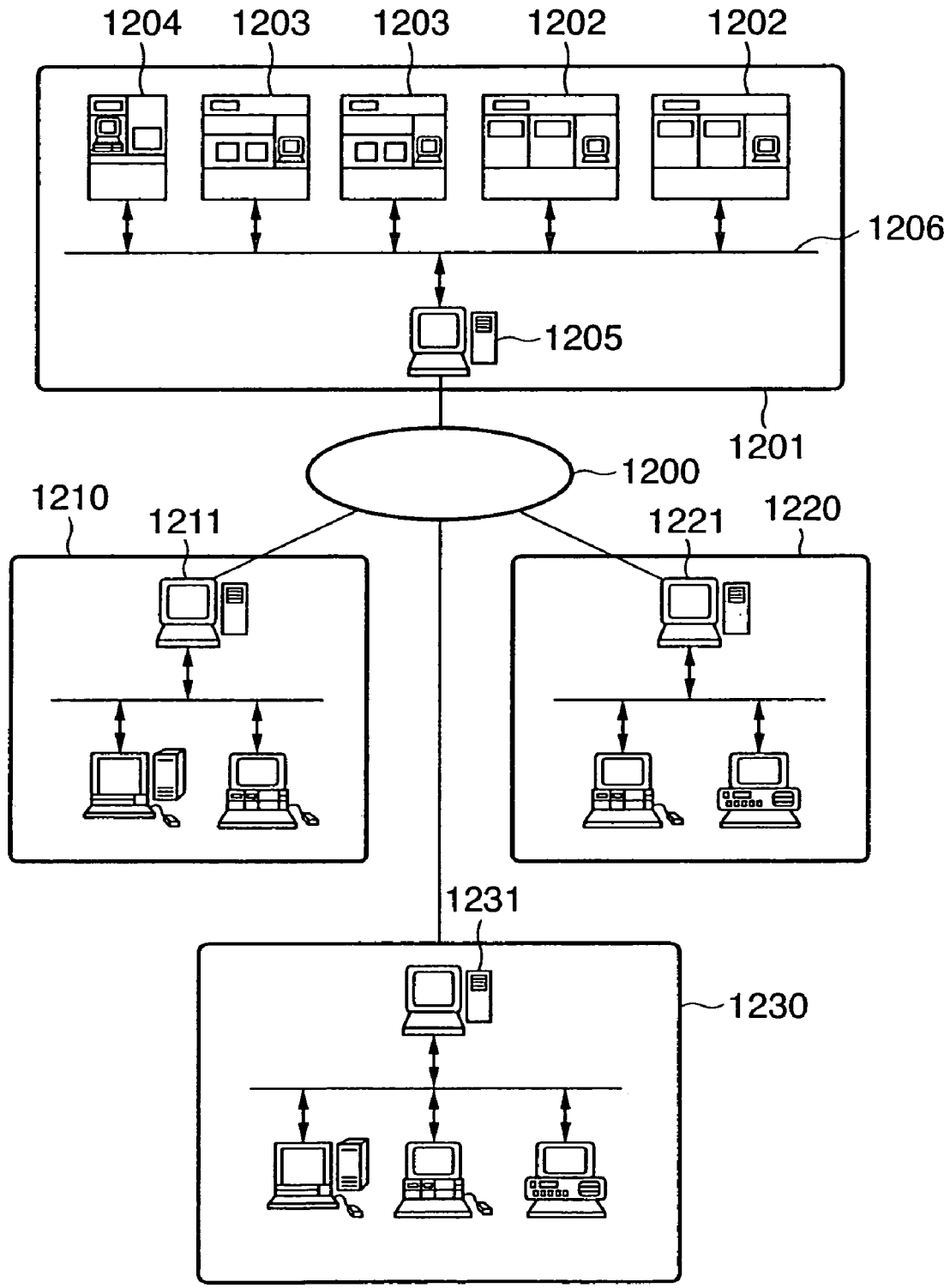
FIG. 10 is a conceptual diagram seen from another angle of the semiconductor device production system including the exposure apparatus according to one embodiment of the present invention.
Figure 12:
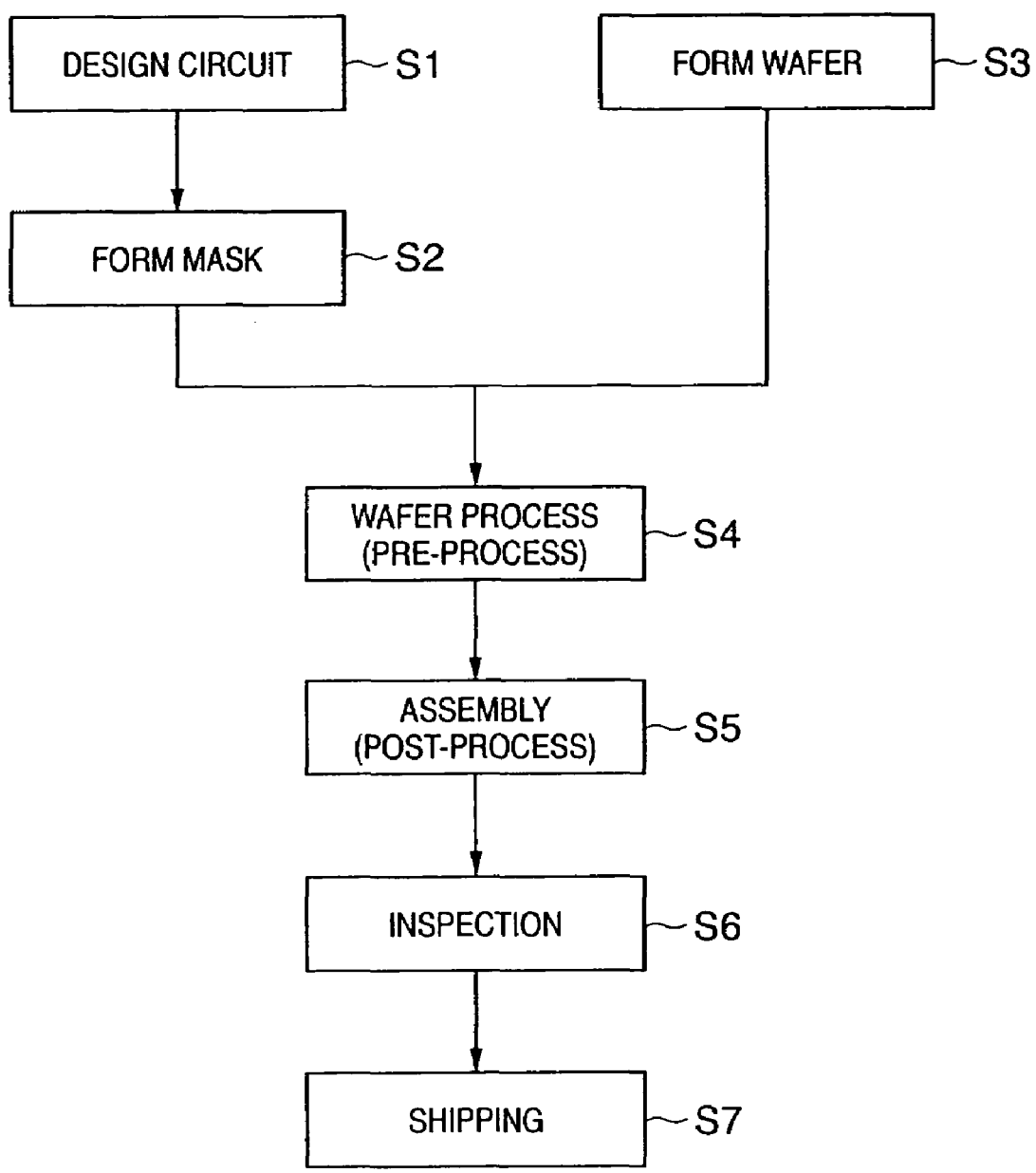
FIG. 12 is a flow chart for explaining the flow of a device fabrication process using the exposure apparatus according to one embodiment of the present invention.

FIG. 10 is a view showing the concept of the overall system of this embodiment that is cut out at a different angle from FIG. 9. In the above example, a plurality of user factories having manufacturing apparatuses and the management system of the manufacturing apparatus vendor are connected via an external network, and production management of each factory or information about at least one manufacturing apparatus is communicated via the external network. In the example of FIG. 10, a factory having a plurality of manufacturing apparatuses provided by a plurality of vendors and the management systems of the vendors for these manufacturing apparatuses are connected via the external network of the factory, and maintenance information about each manufacturing apparatus is communicated. In FIG. 10, reference numeral 1201 denotes a manufacturing factory of a manufacturing apparatus user (e.g., a semiconductor device manufacturer). Manufacturing apparatuses for performing various processes, e.g., an exposure apparatus 1202, a resist processing apparatus 1203, and a film formation apparatus 1204, are installed in the manufacturing line of the factory. FIG. 10 shows only one manufacturing factory 1201, but a plurality of factories are networked in practice. The respective apparatuses in the factory are connected to each other by a LAN 1206 to build an intranet, or the like, and a host management system 1205 manages the operation of the manufacturing line. The offices of vendors (e.g., apparatus supply manufacturers), such as an exposure apparatus manufacturer 1210, a resist processing apparatus manufacturer 1220, and a film formation apparatus manufacturer 1230 comprise host management systems 1211, 1221, and 1231 for executing remote maintenance for the supplied apparatuses. Each host management system 1205, which manages the apparatuses in the manufacturing factory of the user, and the management systems 1211, 1221, and 1231 of the vendors for the respective apparatuses are connected via the Internet or dedicated network serving as an external network 1200. In this system, if trouble occurs in any one of the manufacturing apparatuses along the manufacturing line, the operation of the manufacturing line stops. This trouble can be quickly solved by remote maintenance from the vendor of the apparatus in trouble via the Internet 1200. This can minimize the stoppage of the manufacturing line.

Each manufacturing apparatus in the semiconductor manufacturing factory comprises a display, a network interface, and a computer which executes network access software and apparatus operating software that are stored in a storage device. The storage device is a built-in memory, a hard disk, a network file server, or the like. The network access software includes a dedicated or general-purpose web browser, and provides a user interface with a window as shown in FIG. 11 on the display. While referring to this window, the operator who manages manufacturing apparatuses in each factory inputs, into input fields on the windows, pieces of information such as the model of manufacturing apparatus 1401, serial number 1402, subject of trouble 1403, data of occurrence of trouble 1404, degree of urgency 1405, symptom 1406, remedy 1407, and progress 1408. The pieces of input information are transmitted to the maintenance database via the Internet, and appropriate maintenance information is sent back from the maintenance database and provided on the display. The user interface provided by the web browser realizes hyperlink functions 1410, 1411, and 1412, as shown in FIG. 11. This allows the operator to access more detailed information of each item, download the latest-version software to be used for a manufacturing apparatus from a software library provided by a vendor, and download an operation guide (help information) as a reference for the operator in the factory. The maintenance information provided by the maintenance database includes the above-described information that pertains to the present invention, and the software library also provides the latest software for realizing the present invention.

A semiconductor device manufacturing process using the above-described production system will be explained. FIG.

12 shows the flow of the whole manufacturing process of a semiconductor device. In step S1 (circuit design), a semiconductor device circuit is designed. In step S2 (mask formation), a mask is formed based on the designed circuit pattern. In step S3 (wafer formation), a wafer is formed using a material such as silicon. In step S4 (wafer process), called a pre-process, an actual circuit is formed on the wafer by lithography using the prepared mask and wafer. Step S5 (assembly), called a post-process, is the step of forming a semiconductor chip by using the wafer formed in step S4, and includes an assembly process (dicing and bonding) and a packaging process (chip encapsulation). In step S6 (inspection), the semiconductor device manufactured in step S5 undergoes inspections such as an operation confirmation test and a durability test. After these steps, the semiconductor device is completed and shipped (step S7). The pre-process and post-process are performed in separate dedicated factories, and each of the factories receives maintenance by the above-described remote maintenance system. Information for production management and apparatus maintenance is communicated between the pre-process factory and the post-process factory via the Internet or dedicated network.

Figure 13:
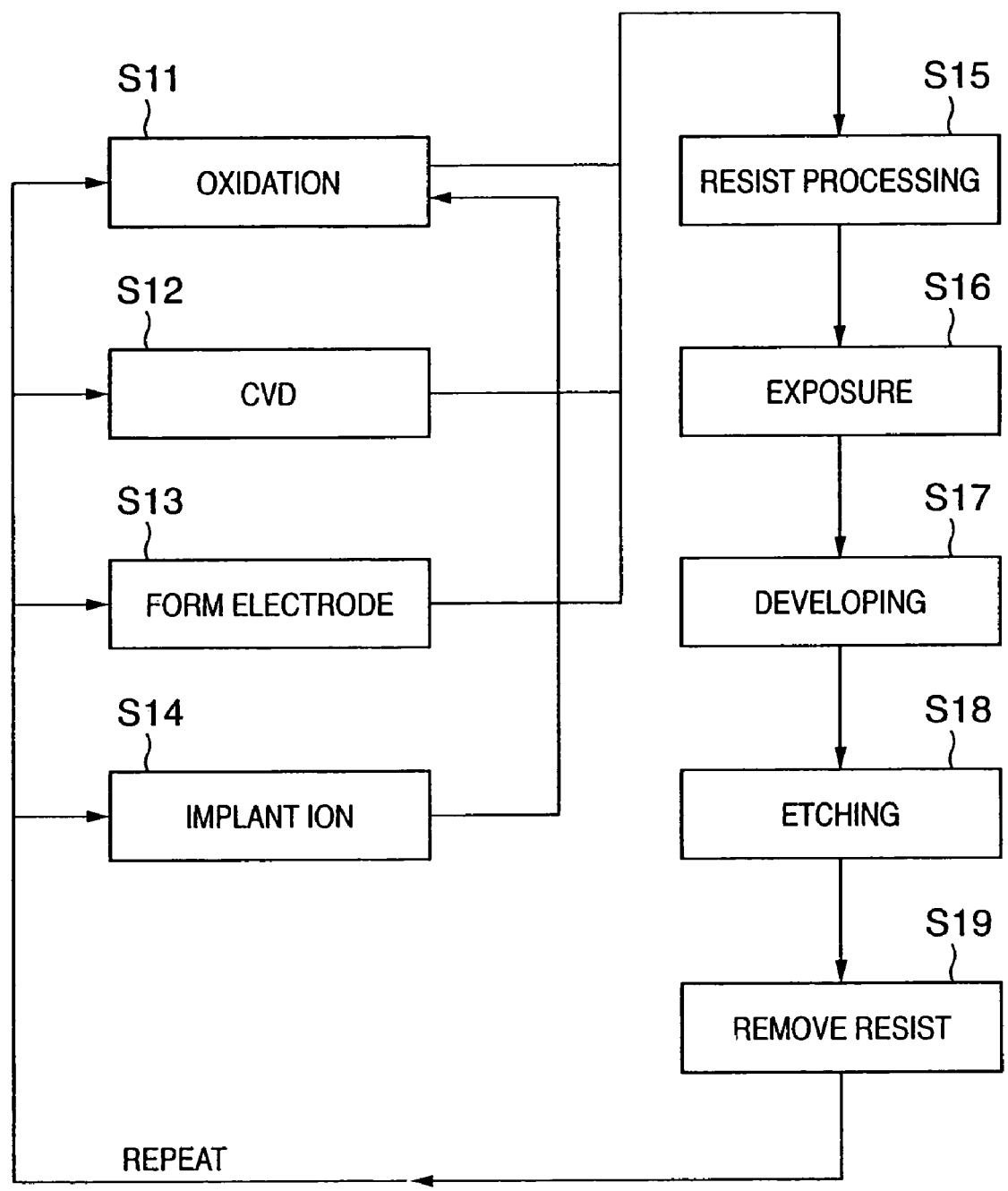
FIG. 13 is a flow chart for explaining a wafer process performed by the exposure apparatus according to one embodiment of the present invention.

FIG. 13 shows the detailed flow of the wafer process. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist processing), a photosensitive agent is applied to the wafer. In step S16 (exposure), the wafer is exposed to the circuit pattern of a mask by the above-mentioned exposure apparatus. In step S17 (developing), the exposed wafer is developed. In step S18 (etching), the resist is etched except the developed resist image. In step S19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The semiconductor device productivity can be increased in comparison with the prior art.

OTHER EMBODIMENT

The present invention is also achieved by supplying a software program (a wavelength selection method and an exposure method according to the present invention) for realizing the functions of the above-described embodiments to a system or apparatus directly or from a remote place, and reading out and executing the supplied program codes by the computer of the system or apparatus. In this case, the software need not be a program as long as it has a program function.

The present invention is, therefore, realized by program codes installed into the computer in order to realize functional processing of the present invention by the computer. That is, the claims of the present invention include a computer program for realizing functional processing of the present invention.

In this case, the present invention can take any program form, such an object code, a program executed by an interpreter, or script data supplied to an operation system (OS), as long as a program function is attained.

A recording medium for supplying the program includes a floppy disk, a hard disk, an optical disk, a magnetooptical disk, an MO, a CD-ROM, a CD-R, a CD-RW, a magnetic tape, a nonvolatile memory card, a ROM, and a DVD (DVD-ROM and DVD-R).

As another program supply method, the program can be supplied by connecting a client computer to an Internet homepage via the browser of the client computer, and downloading the computer program of the present invention or a compressed file containing an automatic installing function from the homepage to a recording medium such as a hard disk. The program can also be supplied by classifying program codes which constitute the program of the present invention into a plurality of files, and downloading the files from different homepages. That is, the claims of the present invention also incorporate a world wide web (WWW) server which allows a plurality of users to download the program files for realizing functional processing of the present invention by a computer.

The present invention can also be realized by the following method. That is, the program of the present invention is encrypted, stored in a storage medium such as a CD-ROM, and distributed to the user. A user who satisfies predetermined conditions is caused to download decryption key information from a homepage via the Internet. The user executes the encrypted program by using the key information and installs the program in the computer.

The functions of the above-described embodiments are realized when the computer executes a readout program. Also, the functions of the above-described embodiments are realized when an OS, or the like, running on a computer, performs part of or all of actual processing on the basis of the instructions of the program codes.

The functions of the above-described embodiments are also realized when a program read out from a storage medium is written in the memory of a function expansion board inserted into a computer or the memory of a function expansion unit connected to the computer, and the CPU of the function expansion board or function expansion unit performs part of or all of actual processing on the basis of the instructions of the program codes.

The present invention is not limited to the above embodiments and various changes and modifications can be made within the spirit and scope of the present invention. Therefore, to apprise the public of the scope of the present invention, the following claims are made.

What is claimed is:

1. An exposure apparatus for exposing an object to radiation via a mask, said apparatus comprising:

a radiation generator having a plurality of nozzles and a laser light source, said plurality of nozzles being configured to spray respective materials different form each other, said radiation generator being configured to radiate material sprayed from at least one of said plurality of nozzles with laser light from said laser light source to generate radiation; and a controller configured to select at least one of said plurality of nozzles to spray respective materials, and configured to cause said laser light source to irradiate material sprayed from said selected at least one of said plurality of nozzles to generate radiation and to expose the object to the generated radiation via the mask.

2. An apparatus according to claim 1, wherein said controller is configured to select at least one of said plurality of nozzles based on information held by the mask.

3. An apparatus according to claim 1, wherein said controller is configured to synchronize spraying material from said selected at least one of said plurality of nozzles and generating laser light from said laser light source.

4. An apparatus according to claim 1, wherein said radiation generator is configured to generate radiation which includes X-rays.

5. A method of manufacturing a device, said method comprising steps of:
    exposing an object to radiation via a mask using an exposure apparatus as defined in claim 1;
    developing the exposed substrate; and
    processing the developed substrate to manufacture the device.

* * * * *